United States Patent [19]

Nakashiba

[11] Patent Number: 5,289,029
[45] Date of Patent: Feb. 22, 1994

[54] SEMICONDUCTOR INTEGRATED CIRCUIT DEVICE HAVING WELLS BIASED WITH DIFFERENT VOLTAGE LEVELS

[75] Inventor: Yasutaka Nakashiba, Tokyo, Japan
[73] Assignee: NEC Corporation, Tokyo, Japan
[21] Appl. No.: 875,830
[22] Filed: Apr. 30, 1992
[30] Foreign Application Priority Data
  May 2, 1991 [JP] Japan ................... 3-130547
[51] Int. Cl.⁵ ............ H01L 27/04; H01L 29/78; H01L 29/796; H01L 29/90
[52] U.S. Cl. .................. 257/400; 257/234; 257/248; 257/491
[58] Field of Search ............... 357/24, 57–63, 357/23.11; 257/400, 491

[56] References Cited

U.S. PATENT DOCUMENTS 4,458,262  7/1984  Chao ................... 357/23.11
4,654,865  3/1987  Sunazuka et al. ............ 357/24

FOREIGN PATENT DOCUMENTS

WO8503807  8/1985  European Pat. Off. .

Primary Examiner—Gene M. Munson
Attorney, Agent, or Firm—Sughrue, Mion, Zinn, Macpeak & Seas

[57] ABSTRACT

A semiconductor integrated circuit device is fabricated on a lightly doped n-type substrate, and p-type wells are formed in the silicon wherein a heavily doped n-type channel stopper is formed in a surface portion between the p-type wells for restricting a parasitic channel between the p-type wells, and the surface portion is doped at a predetermined impurity concentration larger than a remaining portion of the silicon substrate and smaller than the channel stopper so that a p-n junction hardly takes place between the inverted surface portion and the channel stopper.

2 Claims, 3 Drawing Sheets

SEMICONDUCTOR INTEGRATED CIRCUIT DEVICE HAVING WELLS BIASED WITH DIFFERENT VOLTAGE LEVELS

FIELD OF THE INVENTION

This invention relates to a semiconductor device and, more particularly, to electrical isolation between wells of the semiconductor device.

DESCRIPTION OF THE RELATED ART

Referring first to FIG. 1 of the drawings, a semiconductor integrated circuit device such as a solidstate image pick-up device is fabricated on a lightly doped n-type silicon substrate 1, and variable voltage level is applied from a variable voltage source 2 to the lightly doped n-type silicon substrate 1. P-type wells 3 and 4 are formed in surface portions of the lightly doped n-type silicon substrate 1, and a biasing unit 5 biases the p-type wells 3 and 4 to the ground voltage level and −10 volts, respectively. Though not shown in FIG. 1, photo-electric converting regions, a shift register for charge packets and an output circuit coupled with the shift register are formed in the p-type well 3, and an input protection circuit is formed in the p-type well 4 negatively biased. The p-type wells 3 and 4 are spaced apart from each other, and a thick field oxide film 6 is selectively grown on the surfaces of the p-type wells 3 and 4 for providing appropriate electrical isolation. The surface of the lightly doped p-type silicon substrate 1 is covered with thin oxide film 7, and a first inter-level oxide film 8 extends over the thick field oxide film 6 as well as the thin oxide film 7. A metal wiring strip 9 is formed on the first inter-level oxide film 8, and is brought into contact with the p-type well 4 through a contact hole 8a formed in the first inter-level oxide film 8. The metal wiring strip 9 is coupled with the biasing unit 5, and supplies negative voltage level of −10 volts to the p-type well 4. The first inter-level oxide film 8 extends over the photo-electric converting regions in the p-type well 3, and the metal wiring strip 9 is patterned in formation stage for a metallic shield plates ( not shown ) over the photoelectric converting regions.

A heavily doped n-type channel stopper 10 is formed in surface portion between the p-type wells 3 and 4, and is spaced apart from each of the p-type wells 3 and 4 by 10 to 20 microns. The heavily doped n-type channel stopper 10 prevents the surface portion between the p-type wells 3 and 4 from a conductive channel, and is, accordingly, opposed to a parasitic MOS transistor. Namely, the metal wiring strip 9 negatively biased is faced to the surface portion between the p-type wells 3 and 4 through the oxide films 7 and 8, and holes tend to be induced in the surface portion beneath the thin oxide film 7. However, holes are hardly induced in the heavily doped n-type channel stopper 10, and any conductive channel can not bridge the surface portion between the p-type wells 3 and 4.

However, a problem is encountered in the prior art semiconductor integrated circuit device in that breakdown is liable to take place at a junction between the p-type well 4 and the lightly doped n-type silicon substrate 1. In detail, depletion layer extends from the p-type well 3 applied with −10 volts into the doped n-type silicon substrate 1 with relatively low impurity concentration of about $1 \times 10^{14}$ to $5 \times 10^{14}$ cm$^{-3}$, and the electric field tends to be concentrated at the edge of the heavily doped n-type channel stopper 10 identical in conductivity type with the lightly doped n-type silicon substrate 1. Moreover, the metal wiring strip 9 applied with −10 volts extends over the junction, and the inter-level oxide film 8 is relatively thin rather than the width of the depletion layer. For this reason, the electric field at the edge of the heavily doped n-type channel stopper 10 is dominated by surface effects of the parasitic MOS structure thereover, and is, accordingly, promoted. This results in deterioration of the breakdown characteristics at the junction between the p-type well 3 and the lightly doped silicon substrate 1.

SUMMARY OF THE INVENTION

It is therefore an important object of the present invention provide s semiconductor integrated circuit device which is free from the problem inherent in the prior art semiconductor integrated circuit device.

To accomplish the object, the present invention proposes to partially increase the impurity concentration around a heavily doped channel stopper.

In accordance with the present invention, there is provided a semiconductor integrated circuit device fabricated on a semiconductor substrate of a first conductivity type, comprising: a) a first well having a second conductivity type opposite to the first conductivity type, and formed in a first surface portion of the semiconductor substrate, the first well being biased to a first voltage level; b) a second well of the second conductivity type formed in a second surface portion of the semiconductor substrate spaced from the first surface portion, and biased to a second voltage level different from the first voltage level; c) a third surface portion of the semiconductor substrate provided between the first and second wells, and doped with impurity atoms of the first conductivity type higher than a remaining portion of the semiconductor substrate; d) a channel stopper formed in the third surface portion, and doped with impurity atoms of the first conductivity type higher than the third surface portion; e) an insulating film covering at least the first, second and third surface portions; and f) a wiring strip extending over the insulating film, and biased in such a manner as to induce carriers of the second conductivity type in the third surface portion.

BRIEF DESCRIPTION OF THE DRAWINGS

The feature and advantages of the semiconductor integrated circuit device according to the present invention will be more clearly understood from the following description taken in conjunction with the accompanying drawings in which.

DESCRIPTION OF THE PREFERRED EMBODIMENTS

First Embodiment

Figure 2:
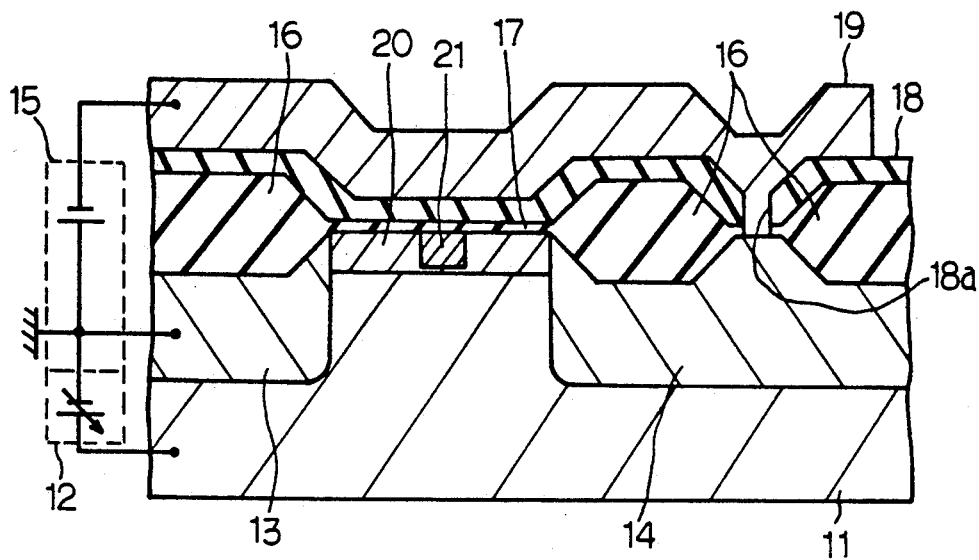
FIG. 2 is a cross sectional view showing the structure of a semiconductor integrated circuit device according to the present invention.

Referring to FIG. 2 of the drawings, a solid-state image pick-up device is fabricated on a single lightly doped n-type silicon substrate 11, and variable voltage level is applied from a variable voltage source 12 to the lightly doped n-type silicon substrate 11. P-type wells 13 and 14 are formed in surface portions of the lightly doped n-type silicon substrate 11, and a biasing unit 15 biases the p-type wells 13 and 14 to the ground voltage level and negative voltage level of $-10$ volts, respectively. In this instance, the p-type wells 13 and 14 are doped at about $5 \times 10^{18}$ cm$^{-3}$.

Figure 3:
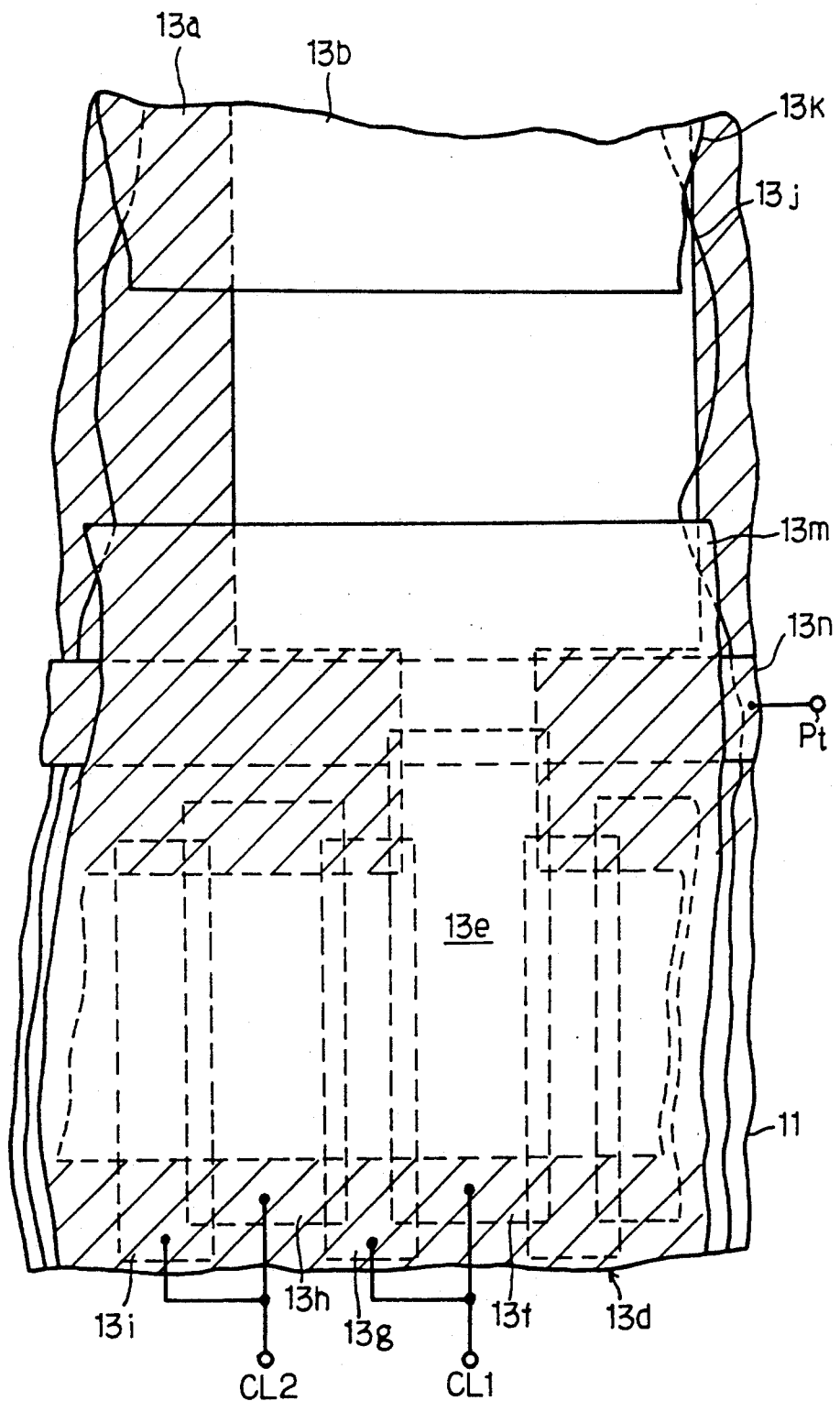
FIG. 3 is a plan view showing the arrangement in a well incorporated in the semiconductor integrated circuit device shown in FIG. 2.

In this instance, photo-electric converting elements, a transfer gate, a vertical shift register for charge packets and an output circuit coupled with the vertical shift register are formed in the p-type well 13, and an input protection circuit is formed in the p-type well 14 negatively biased. Namely, FIG. 3 shows the layout in the p-type well 13 of the lightly doped n-type semiconductor substrate 11, and a channel stopper 13a provides an electrical isolation between adjacent photo electric converting elements 13b and a vertical shift register 13d. Only one of the photo electric converting elements is shown i FIG. 3. The channel stopper 13a is indicated by hatch lines for better understanding. Each of the photo-electric converting elements 13b is implemented by a p-n junction type photo diode. In a surface portion of the semiconductor substrate 11 is further formed an n-type impurity region 13e which forms the shift register 13d together with transfer gate electrodes 13f, 13g, 13h and 13i embedded in an insulating film 13j in a partially overlapping manner. The transfer gate electrodes 13f and 13g are supplied with a first phase clock pulse CL1, and a second phase clock pulse CL2 is fed to the transfer gate electrodes 13h and 13i. The vertical shift register 13d thus arranged transfers a data signal in the form of charge packet in synchronization with the two phase clock signal in the left direction of FIG. 3. Photo shield plates 13k and 13m are provided on the insulating film 13j, and are spaced from each other for exposing a part of photo electric converting elements 13b and 13c to an optical radiation carrying photo images. Parts of the optical radiation are converted into electric charges the amounts of which are dependent upon the respective intensities of the parts of the optical radiation. Although the photo electric converting element 13b is spaced apart form the vertical shift register 13d, a transfer gate electrode 13n allows the electric charges to flow into the vertical shift register 13d. The transfer gate electrode 13n is partially overlapped with the photo-electric converting element 13b, and the edge of the transfer gate electrode 13f extends below the transfer gate electrode 13n. Then, the electric charges accumulated in the photo-electric converting element 13b are read out to the shift register 13d in the presence of a transfer pulse Pt of a high voltage level fed to the transfer gate electrode 13n, and the vertical shift register 13d transfers the electric charges as one of the charge packets in synchronization with the two phase shift clock signal as described above.

Turning back to FIG. 2, the p-type wells 13 and 14 are spaced apart from each other, and a thick field oxide film 16 is selectively grown on the surfaces of the p-type wells 13 and 14 for providing appropriate electrical isolation. The surface of the lightly doped p-type silicon substrate 11 is covered with thin oxide film 17, and an inter-level oxide film 18 extends over the thick field oxide film 16 as well as the thin oxide film 17. A metal wiring strip 9 is formed on the inter-level oxide film 18, and is brought into contact with the p-type well 14 through a contact hole 18a formed in the inter-level oxide film 18. The metal wiring strip 19 is coupled with the biasing unit 15, and supplies negative voltage level of $-10$ volts to the p-type well 14. The inter-level oxide film 18 extends over the photo-electric converting elements in the p-type well 13, and the metal wiring strip 19 is patterned in formation stage for the metallic shield plates 13k and 13m.

The lightly doped n-type silicon substrate 11 is doped at about $2 \times 10^{14}$ cm$^{-3}$; however, the impurity concentration of the lightly doped n-type silicon substrate 11 may range from $1 \times 10^{14}$ cm$^{-3}$ to $5 \times 10^{14}$ cm$^{-3}$. A surface portion 11a between the p-type wells 13 and 14 is larger in impurity concentration than the above impurity range of the silicon substrate 11, and the impurity concentration of the surface portion 20 ranges from $1 \times 10^{17}$ to $2 \times 10^{17}$ cm$^{-3}$ in this instance. In the surface portion 20 is formed a heavily doped n-type channel stopper 21 which is larger in impurity concentration than the surface portion 20, and the heavily doped n-type channel stopper 21 is doped at about $1 \times 10^{22}$ cm$^{-3}$ in this instance. The heavily doped n-type channel stopper 21 prevents the p-type wells 13 and 14 from a parasitic MOS transistor as similar to that of the prior art. Even if extremely high voltage level ranging from 30 volts to 50 volts are applied to the lightly doped silicon substrate 11, any parasitic MOS structure never turns on, and the p-n junction between the p-type well 14 and the lightly doped silicon substrate 11 is free from any breakdown, because the surface portion 20 restricts depletion layer extending from the p-type well 14 into the lightly doped silicon substrate 11.

Figure 4:
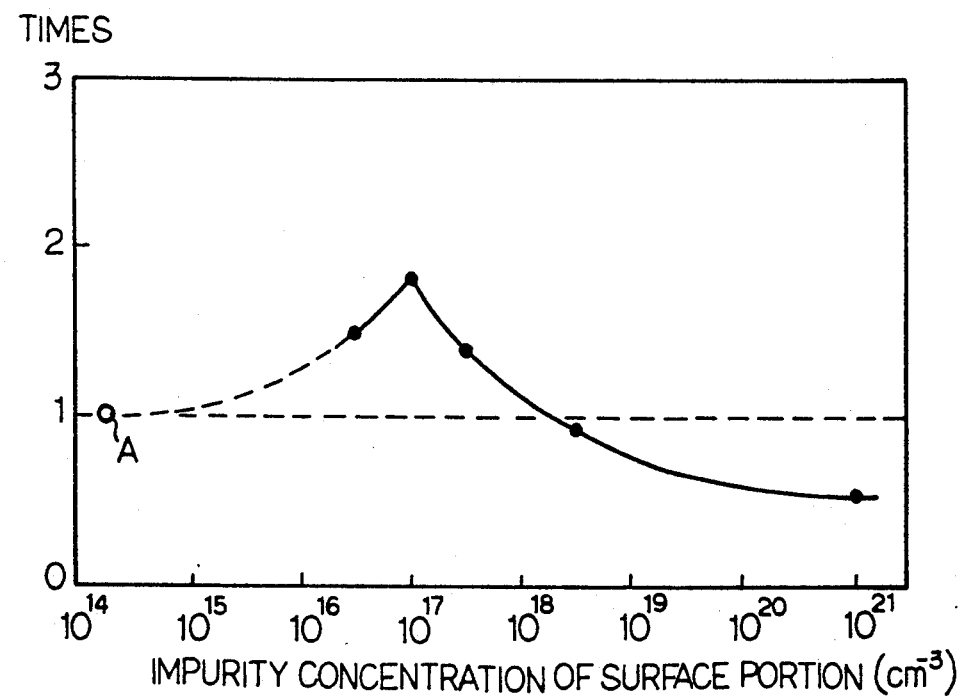
FIG. 4 is a graph showing improvement in breakdown voltage in terms of a surface portion around a channel stopper.

FIG. 4 shows improvement in the breakdown voltage level at the p-n junction in terms of the impurity concentration of the surface portion 20. A small bubble A stands for the breakdown voltage of the prior art semiconductor integrated circuit device, and dots is indicative of the breakdown voltage in terms of the impurity concentration of the surface portion 20. If the impurity concentration is adjusted to $1 \times 10^{17}$ cm$^{-3}$, the breakdown voltage is about 1.8 times higher than that of the prior art.

Second Embodiment

Figure 5:
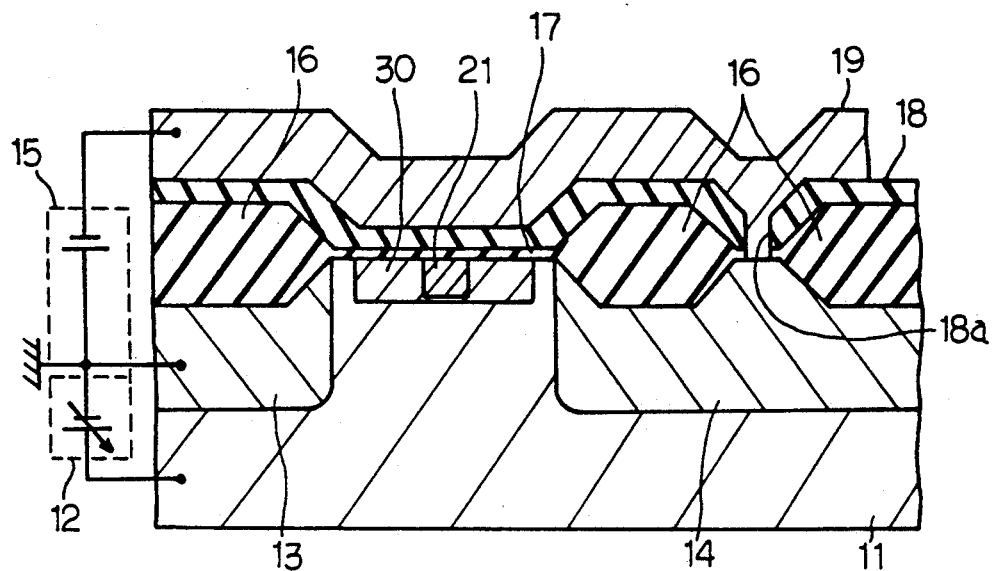
FIG. 5 is a cross sectional view showing the structure of another semiconductor integrated circuit device according to the present invention.
Figure 1:
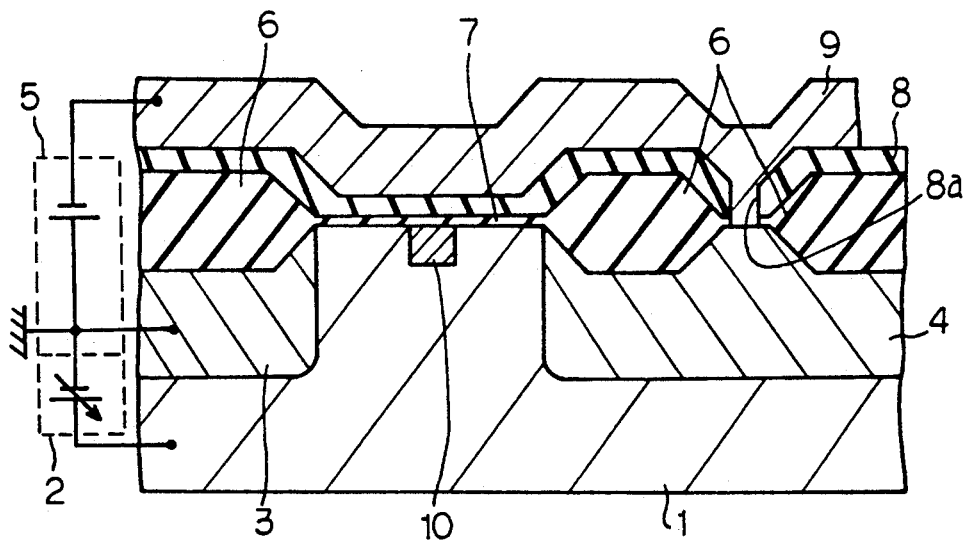
FIG. 1 is a cross sectional view showing the structure of the prior art semiconductor integrated circuit device.

Turning to FIG. 5 of the drawings, another semiconductor integrated circuit device is illustrated. The semiconductor integrated circuit device shown in FIG. 5 is similar to the solid-state image pick-up device except for an n-type surface portion 30, and, for this reason, regions and films thereof are labeled with the same references designating the corresponding regions and films of the first embodiment without detailed description for the sake of simplicity. The n-type surface portion 30 is larger in impurity concentration than a remaining portion of the semiconductor substrate 11 and is smaller in impurity concentration than the n-type channel stopper 21. However, the surface portion 30 is not contiguous to the p-type wells 13 and 14. By virtue of the spaced n-type surface portion 30, even if the impurity concentration of the n-type surface portion 30 is higher than the n-type surface portion 20, the similar advantage is achieved by the n-type surface portion 30.

As will be understood from the foregoing description, the surface portion between the wells suppresses the depletion layer extending from the p-type well 14 into the silicon substrate 11, and the p-n junction between the p-type well 14 and the silicon substrate 11 is hardly broken down.

Although particular embodiments of the present invention have been shown and described, it will be obvious to those skilled in the art that various changes and modifications may be made without departing from the spirit and scope of the present invention. For example, the present invention is applicable to not only a solid-state image pick-up device but also any semiconductor integrated circuit device with a plurality of wells differently biased.

What is claimed is:

1. A semiconductor integrated circuit device fabricated on a semiconductor substrate of a first conductivity type, comprising:
    a) a first well having a second conductivity type opposite to said first conductivity type, and formed in a first surface portion of said semiconductor substrate, said first well being biased to a first voltage level;
    b) a second well of said second conductivity type formed in a second surface portion of said semiconductor substrate spaced from said first surface portion, and biased to a second voltage level different from said first voltage level;
    c) a third surface portion of said semiconductor substrate provided between said first and second wells, and doped with impurity atoms of said first conductivity type ranging between $1 \times 10^{17}$ cm$^{-3}$ and $2 \times 10^{17}$ cm$^{-3}$, the impurity concentration of a remaining portion of said semiconductor substrate ranging between $1 \times 10^{14}$ cm$^{-3}$ and $5 \times 10^{14}$ cm$^{-3}$;
    d) a channel stopper formed in said third surface portion, and doped with impurity atoms of said first conductivity type higher than said third surface portion;
    e) an insulating film covering at least said first, second and third surface portions; and
    f) a wiring strip extending over said insulating film, and biased in such a manner as to induce carriers of said second conductivity type in said third surface portion.

2. A semiconductor integrated circuit device as set forth in claim 1, in which the impurity concentration of said channel stopper is adjusted to about $1 \times 10^{22}$ cm$^{-3}$.

* * * * *

UNITED STATES PATENT AND TRADEMARK OFFICE
CERTIFICATE OF CORRECTION

PATENT NO. : 5,289,029
DATED : February 22, 1994
INVENTOR(S) : Yasutaka Nakashiba It is certified that error appears in the above-indentified patent and that said Letters Patent is hereby corrected as shown below:

Col. 1, line 30, delete "p-type" and insert —n-type—;
Col. 1, line 64, delete "3" and insert —4—;
Col. 2, line 16, delete "provide s" and insert —to provide a—;
Col. 3, line 27, delete "i" and insert —in—;
Col. 3, line 50, delete "form" and insert —from —.

Signed and Sealed this

Twenty-third Day of August, 1994

Attest:

BRUCE LEHMAN

*Attesting Officer*  *Commissioner of Patents and Trademarks*